(12) United States Patent
McAllister et al.

(10) Patent No.: US 6,433,562 B1
(45) Date of Patent: Aug. 13, 2002

(54) METHOD AND APPARATUS OF INTERCONNECTING WITH A SYSTEM BOARD

(75) Inventors: Michael F. McAllister, Clintondale, NY (US); Klaus K. Kempter, Holzgerlingen (DE); Charles F. Pells, Wappingers Falls, NY (US); Stephan R. Richter, Boeblingen; Gerhard Ruehle, Sommerhofenstrasse, both of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/143,228

(22) Filed: Aug. 28, 1998

(51) Int. Cl.$^7$ ............................................... G01R 31/28
(52) U.S. Cl. ..................................... 324/754; 324/158.1
(58) Field of Search ................................. 324/754, 761, 324/762, 765, 73.1, 158.1; 439/482, 824, 35, 78

(56) References Cited

U.S. PATENT DOCUMENTS

| | | | |
|---|---|---|---|
| 4,731,577 A | * 3/1988 | Logan | 324/754 |
| 4,904,935 A | * 2/1990 | Calma et al. | 324/73.1 |
| 4,931,726 A | * 6/1990 | Jasyjabe et al. | 439/482 |
| 5,001,422 A | 3/1991 | Dahlberg et al. | 324/158 |
| 5,101,151 A | 3/1992 | Beaufils et al. | 324/158 |
| 5,251,150 A | 10/1993 | Ladner et al. | 364/550 |
| 5,283,518 A | * 2/1994 | King et al. | 324/761 |
| 5,389,874 A | 2/1995 | King et al. | 324/758 |
| 5,497,103 A | * 3/1996 | Ebert et al. | 324/754 |
| 5,572,144 A | * 11/1996 | Davidson et al. | 324/755 |
| 5,703,494 A | 12/1997 | Sano | 324/761 |

OTHER PUBLICATIONS

Davis et al ,"Auto test CPU interface", IBM technical Disclosure Bulletin, vol. 13, No. 11 Apr. 1971, pp. 3583–3584.*

* cited by examiner

Primary Examiner—Vinh P. Nguyen
(74) Attorney, Agent, or Firm—Floyd Gonzalez; Cantor Colburn LLP

(57) ABSTRACT

A method and apparatus of interconnecting with a system board is presented. A system board having a metal stiffener mounted thereon is provided with an opening in the stiffener to provide access to an area of interest on the system board. A probe test assembly is positioned at the opening and secured to the stiffener when testing is desired to provide access to the pins of the device under test (e.g., a Multi Chip Module (MCM) on the system board). Alternatively, a system enhancement device, such as a MCM or Single Chip Module (SCM) having additional Central Processing Units (CPU's) or other features, may be installed on the system board at the opening in the stiffener to enhance the function of the system board. Another alternate includes an interface assembly positioned at the opening in the stiffener. A cover is positioned at the opening and secured to the stiffener at all other times.

24 Claims, 7 Drawing Sheets

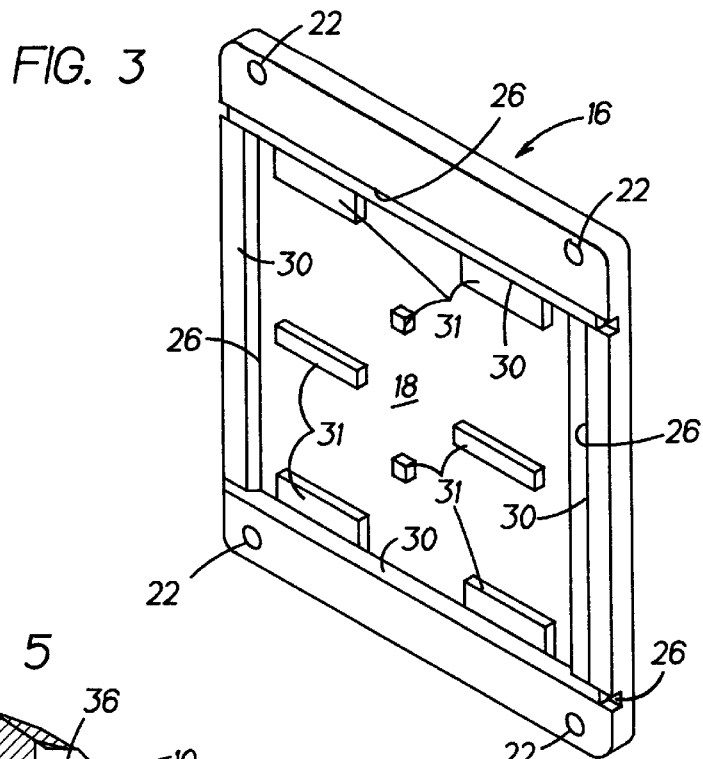
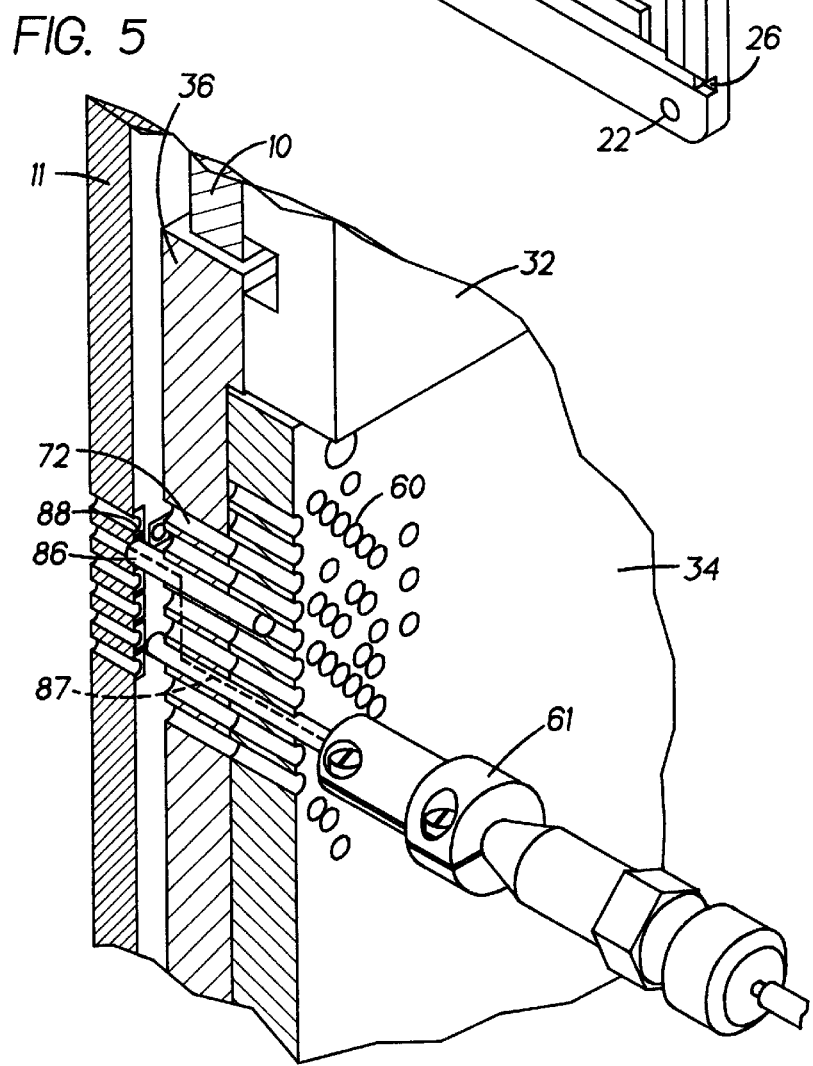

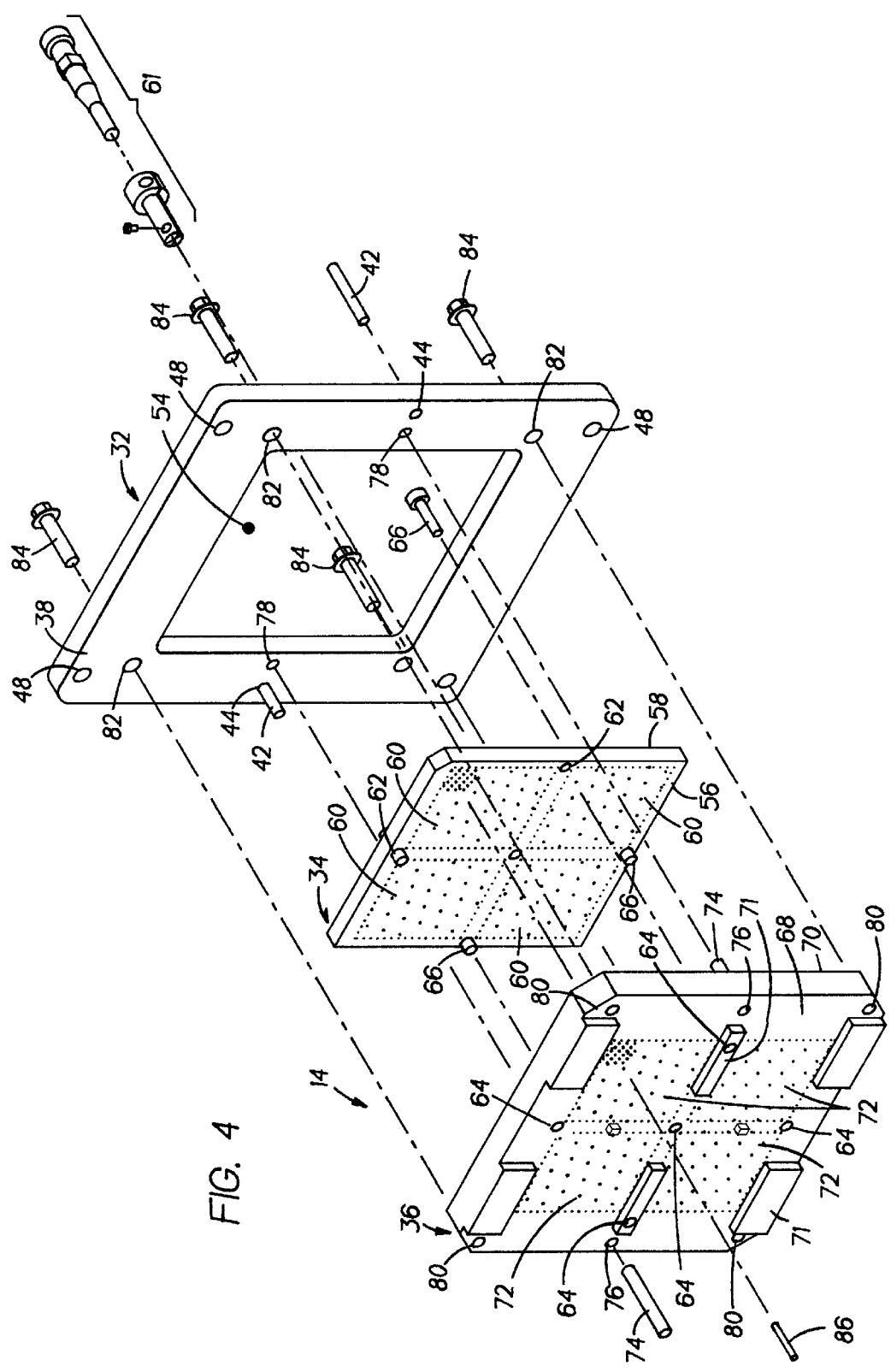

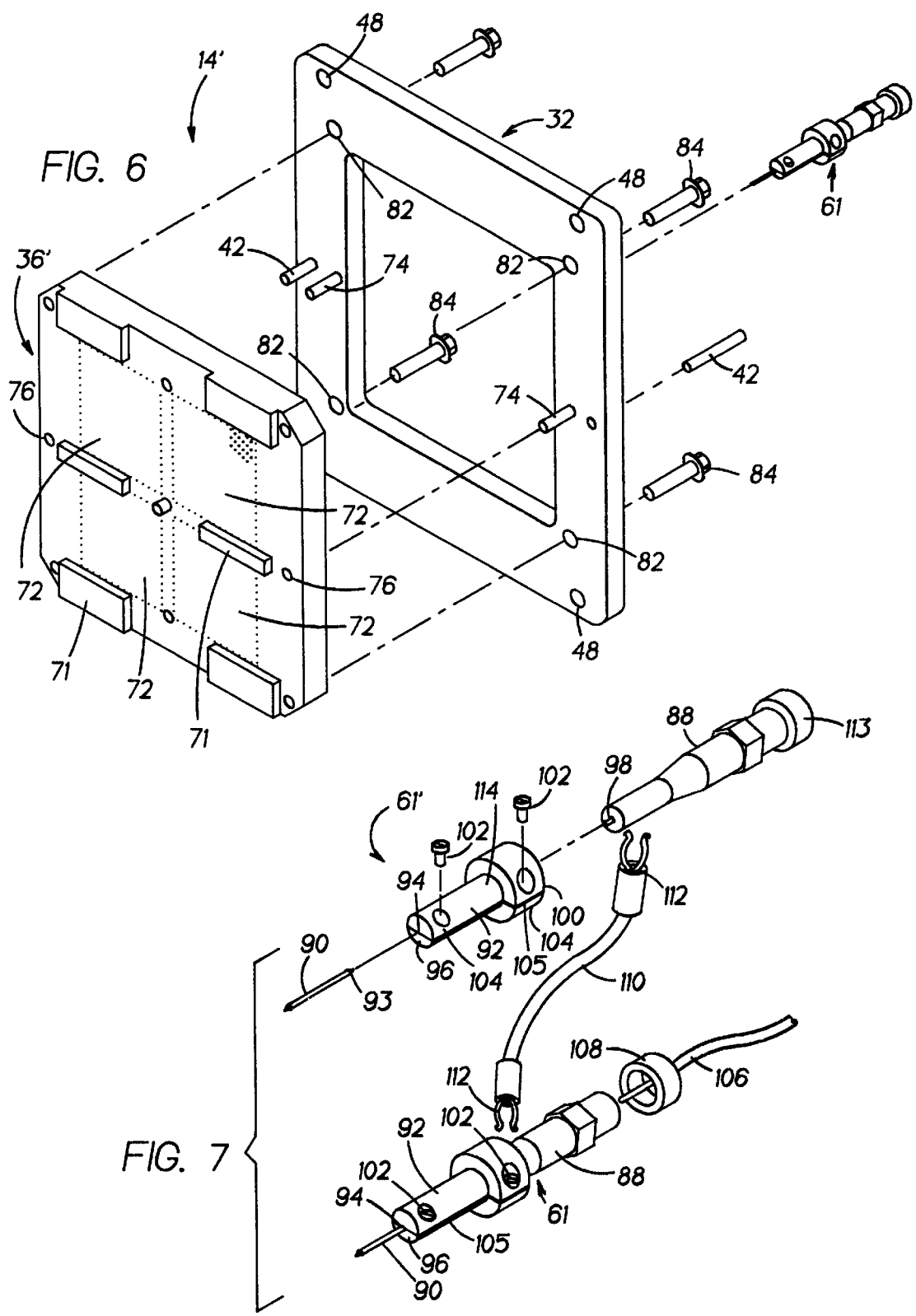

METHOD AND APPARATUS OF INTERCONNECTING WITH A SYSTEM BOARD

BACKGROUND OF THE INVENTION

The present inventions relates to a method and apparatus of interconnecting with a system board for the purposes of testing and/or implementation of engineering changes. More specifically, the present invention relates to an interconnection scheme where access is provided to an area of interest on the system board for probing and/or connecting to signals on a system board or a component thereon.

In the testing of large systems during the initial bring up and including debugging of system hardware, special modifications are typically made to the product. A metal stiffener used to support the large system boards is machined so that an open access is provided to e.g., pins of a Multi Chip Module (MCM) as well as providing access to other points of interest. There are presently two methods used to measure system operations; destructive and nondestructive measurement techniques. These are accomplished either by direct soldering of probe connectors to the system board or by the use of an insulated template and probe arrangement. The first method, direct soldering, provides good high frequency measurements but has many limitations and disadvantages. These limitations and disadvantages include, for example, the requirement that the board must be removed from the test fixture each time a connection is to be soldered on, the number of connections present at any time is limited and the connections are susceptible to mechanical failure (e.g., such as being broken off). The second method, utilizing the probe template, offers a full range of interconnections, by means of holes drilled through a template made of an insulating material, at all signal locations as well as selected ground or voltage reference locations of the MCM. This arrangement is limited to measurements in the 500 MHZ bandwidth region. Thus, while this template arrangement is adequate for error injection and some mid-frequency a.c. measurements, it is not suitable for analysis of high frequency switching noise and circuit operation verification.

Another common problem related to system boards lies in implementing system upgrades and functional enhancements of the system board. Presently such system upgrades and functional enhancements require the system board to be replaced. This leads to expensive component rework, handling, and significant impact of computer availability at both the development lab and customer's office.

Still yet another problem related to system boards is that in the initial bring up of a machine, it is sometimes necessary to temporary change or repair a nets' termination. Present methods include a destructive mechanical solution of soldering terminating resistors, tie down to ground or a tie up to a voltage on the system board. Again, any time that a component needs to be attached to the system board, the system board must be removed from the test fixture. This impacts test time, availability of the machine, and the over all schedule of a products' development.

SUMMARY OF THE INVENTION

The above-discussed and other drawbacks and deficiencies of the prior art are overcome or alleviated by the method and apparatus of interconnecting with a system board of the present invention. In accordance with the present invention, a system board having a metal stiffener (or other such structure) mounted thereon is provided with an opening in the stiffener to provide access to an area of interest on the system board. A probe test assembly is positioned at the opening and secured to the stiffener when testing is desired to provide access to the pins of the device under test (e.g., a Multi Chip Module (MCM) on the system board). A cover is positioned at the opening and secured to the stiffener at all other times.

The probe test assembly in one embodiment of the present invention (high frequency testing applications) comprises an insulated pattern guide plate and a metal (conductive) probe plate which are positioned at the opening and secured to the stiffener by an insulated frame. The insulated frame insulates the metal probe plate from the stiffener. The plates have a pattern or array of holes corresponding to the pattern of pins on the MCM (i.e., the device under test). The insulated pattern plate protects ground pins in the probe plate from being exposed. In high frequency applications the metal probe plate is part of the measurement system. The metal probe plate has resilient ground terminals pressed into selected holes therein which provide a low impedance ground return path for test measurements. For low bandwidth or d.c. testing applications the pattern plate is eliminated and the probe plate is comprised of an insulation material, whereby the probe plate does not form part of the aforementioned ground return path. Since the probe plate in this alternate embodiment is non-conductive a ground pin is not provided.

Alternatively, a system enhancement device, such as a MCM or Single Chip Module (SCM) having additional Central Processing Units (CPU's) or other features, may be installed on the system board to enhance the function of the system board, providing the system board has reserved I/O interfaces at the location of the opening in the stiffener. The enhancement device is retained by a frame which is mounted to the stiffener after the cover has been removed.

In accordance with another alternate embodiment of the present invention an interface assembly is positioned at the opening in the stiffener, after the cover has been removed, and is retained and located thereat by the frame. The interface assembly provides for system board engineering change capabilities and functional upgrade capabilities, providing that the system board has reserved MCM pin locations and spare nets which are prewired in the system board. The interface assembly comprises an interface board and an interconnect printed circuit board. A pattern or array of holes corresponding to the pattern of I/O interfaces (pads) on the system board are provided through the interface board. Resilient coaxial probe connectors (pins) are located in selected holes for connecting to signal pads. Double ended ground pins are located in selected holes for providing a return or ground connection. A connector is connected to signal and ground traces/pads on the interconnect circuit board and is receptive to a mating connector to provide access to the this signal and ground pair for testing (or other purposes).

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 3 is a perspective view of the cover of FIG. 2;

FIG. 4 is an exploded perspective view of the probe test assembly in accordance with an embodiment of the present invention;

FIG. 5 is a partial enlarged perspective view of the probe test assembly of FIG. 4 with a system board;

FIG. 6 is an exploded perspective view of the probe test assembly in accordance with an alternate embodiment of the present invention;

FIG. 7 is a perspective view of the probe assemblies of the present invention;

DESCRIPTION OF THE PREFERRED EMBODIMENT

Figure 1:
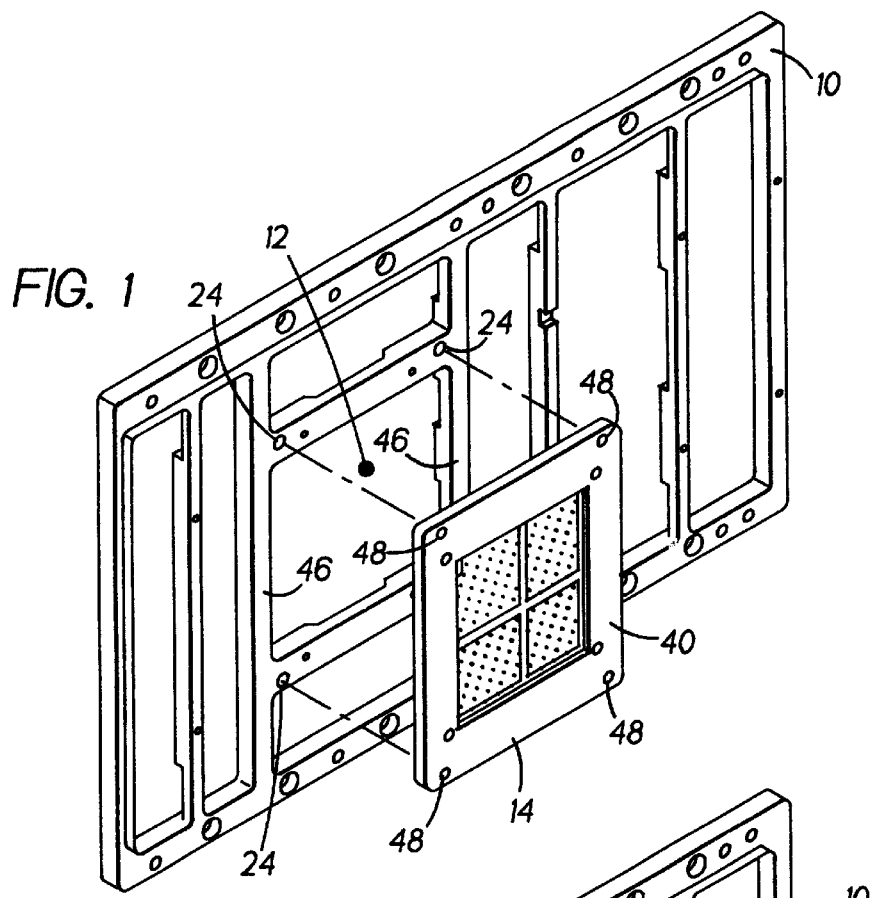
FIG. 1 is an exploded perspective view of a stiffener with a probe test assembly in accordance with the present invention.
Figure 2:
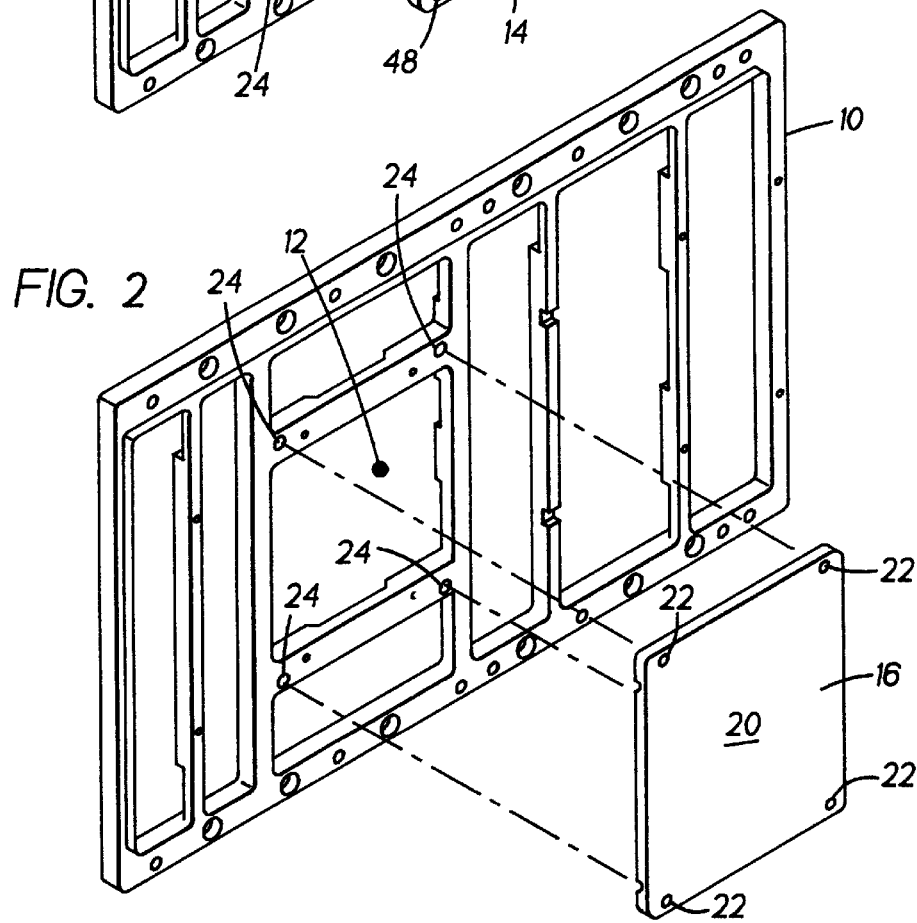
FIG. 2 is an exploded perspective view of a stiffener with a cover in accordance with the present invention.

Referring to FIGS. 1 and 2, a metal stiffener 10 used to support a large system board 11 (FIG. 5) has an opening 12 defined (e.g., machined) therein. The opening is also referred to herein as a manhole. The use of a metal stiffener (or other supporting structure) to support a large system board is well known. The opening 12 in the stiffener 10 is located to provide access to an area of interest on the large system board 11, such as the pin side of a Multi Chip Module (MCM), not shown, which is referred to herein as a Device Under Test (DUT). It will be appreciated that the scope of the present invention encompasses providing access for testing (or other purposes) of any component that is normally covered by a stiffener and is not limited to a MCM. A probe test assembly 14 (FIG. 1) is positioned at the opening 12 when testing (e.g., a system test, such as when error injection and recovery, is required to understand and circumvent system failure mechanisms) is desired, thereby providing access to the pins of the MCM (i.e., the DUT), as is described hereinafter. A cover 16 (FIG. 2), also referred to herein as a manhole cover, is positioned at the opening 12 at all other times to cover the pins of the MCM, thereby serving to protect the pins of the MCM. The probe test assembly 14 and the cover 16 are preferably shaped similar to the opening 12, although any shape may be employed. In the present example, the probe test assembly 14 and the cover 16 are generally square (as is the opening 12).

Referring now to FIGS. 2 and 3, the cover 16 has opposing surfaces 18, 20 with the surface 18 facing the stiffener 10. The cover 16 has four mounting holes 22 therethrough which align with a plurality of mounting holes 24 in the stiffener 10. The cover 16 is secured onto the stiffener 10 by screws (or other suitable fastening means), not shown, through these mounting holes. A channel 26 is provided about the periphery of the cover 16 in the surface 18. This channel 26 may be defined by a plurality of intersecting channels as shown in FIG. 3 or by a continuous channel. Electromagnetic Control (EMC) shielding between the cover 16 and the MCM is provided by a compressible EMC gasket 30 mounted in the channel 26. When the cover 16 is mounted by the screws to the stiffener 10 the gasket 30 is compressed and the effects of EMC noise scattering is minimized. The cover 16 may also provide mechanical support structure, if such is required as a result of the opening 12 weakening the stiffener 10. The cover 16 is preferably comprised of the same material as the stiffener 10. A plurality of spacers or standoffs 31 are provided at surface 18 to structurally reinforce the system board 11 which may have been weakened by the removal of material in the stiffener 10 when the opening 12 was provided.

Referring to FIGS. 4 and 5, the probe test assembly 14 comprises a frame 32, a pattern plate 34 and a probe plate 36. The frame 32 has opposing surfaces 38, 40 (FIG. 1) with the surface 38 facing the stiffener 10. A plurality of alignment pins 42 are mounted in holes 44 of the frame 32 and extend from away from surface 38. The pins 42 are received in corresponding alignment holes 46 (FIG. 1) in the stiffener 10 to correctly position the probe test assembly 14 relative to the pins of the MCM. The frame 32 has four mounting holes 48 therethrough which align with the plurality of mounting holes 24 in the stiffener 10. The probe test assembly 14 is secured onto the stiffener 10 by screws (or other suitable fastening means), not shown, through these mounting holes. The frame 32 has an access opening 54 therein for providing access to the pattern and probe plates 34, 36. The frame 32 is preferably comprised of an insulation material such as FR4, thereby insulating the plate 36 from the stiffener 10. The probe test assembly 14 of this exemplary embodiment is particularly well suited for high frequency measurement applications, as described MORE fully hereinafter. Further, it is an important feature of the present invention that the probe test assembly 14 provides for nondestructive probing of the MCM pins.

The pattern plate 34 has opposing surfaces 56, 58 with the surface 56 facing the probe plate 36. A pattern or array of guide holes 60 corresponding to the pattern of pins on the MCM (i.e., the DUT) are provided through the plate 34 that provide an insulated guide path for a probe 61. The pattern plate 34 has a plurality holes 62 therethrough which align with a plurality of mounting holes 64 in the probe plate 36. The pattern plate 34 is secured onto the probe plate 36 by screws 66 (or other suitable fastening means) through these mounting holes. The pattern plate 34 is preferably comprised of an insulation material such as FR4. Preferably, the surface 58 includes nomenclature (not shown) indicative of the I/O pins of the MCM inscribed thereon.

The probe plate 36 has opposing surfaces 68, 70 with the surface 68 facing the stiffener 10. A plurality of spacers or standoffs 71 are provide at surface 68 to aid in positioning the probe test assembly 14 relative to the pins of the MCM. The standoffs 71 also serve to structurally reinforce the system board 11 which may have been weakened by the removal of material in the stiffener 10 when the opening 12 was provided. A pattern or array of probe holes 72 also corresponding to the pattern of pins on the MCM (i.e., the DUT) are provided through the plate 36. The pattern of guide holes 60 in the pattern plate 34 may comprise a full compliment of I/O locations in the probe plate 36, thus providing access to all locations. Alternatively, the pattern of guide holes 60 in the pattern plate 34 may comprise a limited number of holes suitable for testing applications that required multiple testing of a limited number of signal locations. Such limited testing access would, by design, limit the incidence of probing errors and possibilities of causing a device to cease functioning, especially in an environment where the device was mission critical and could not be stopped. A plurality of alignment pins 74 are mounted in holes 76 of the probe plate 36 and extend away from surface 70. The pins 74 are received in corresponding alignment holes 78 in the frame 32 to position the pattern and probe plates 34, 36 on the frame 32 and ultimately relative to the pins of the MCM. The probe plate 36 has four mounting holes 80 therethrough which align with a plurality of mounting holes 82 in the frame 32. The probe plate 36 is secured onto the frame 32 by screws 84 (or other suitable fastening means) through these mounting holes. In high frequency applications the plate 36 is metal and is part of the measurement system. The metal plate 36 has resilient ground terminals 86 pressed into selected probe holes 72 which provide a low impedance ground return path for test measurements. These ground terminals (or pins) 86 provide a permanent return path that is uniform and consistent every time the probe test assembly 14 is used. An exemplary ground path is shown by the broken line 87 in FIG. 5 where ground pin 86 contacts a ground pad 88 on the system board 11. The probe 61 is a high frequency probe which is used to access signal points (i.e., pins of the MCM) through the appropriate hole 60, 72, with the signal return path being provided by the close proximity of the ground pins 86. The pattern plate 34 provides a non-conductive mechanical cover of the exposed grounding pins 86 in the metal probe plate 36. As described hereinbefore, plate 36 is insulated from the stiffener 10 by the insulating material of the frame 32 to enhance the measurement integrity thereby insuring that the noise generated by other package components are not coupled in the measurements.

Referring now to FIG. 6, an alternate embodiment of the probe test assembly of the present invention is shown. It will be noted that elements common to the above described embodiment are numbered the same, whereby reference should be made thereto for a description thereof. This alternate embodiment is particularly well suited for low bandwidth or d.c. testing applications. This probe test assembly 14' comprises the frame 32 (which is the same as the frame 32 described hereinbefore with reference to FIGS. 4 and 5) and a probe plate 36'. The probe plate 36' is the same as the probe plate 36 described hereinbefore with reference to FIGS. 4 and 5, with the exception that the probe plate 36' is comprised of an insulation material such as FR4, instead of metal, whereby the plate 36' does not in this alternate embodiment form part of the aforementioned ground return path (FIG. 5). Since the probe plate 36' is non-conductive a ground pin is not provided pressed into selected probe holes 72. The probe 61 shown in this FIGURE is the signal probe only and is used to access signal points through the appropriate probe hole 72. A ground probe is also required with low frequency probing, as is further described hereinafter.

Referring to FIG. 7, with a high frequency, i.e., measurement capability in the 3–9 Ghz range, resilient probe 61 (as described in the embodiment of FIGS. 4 and 5) comprises a probe body 88, e.g., a Textronix 10:1 or 1:1 probe body such as P/N 206-0399-00 and 206-0398-00. A 50 ohm coaxial resilient double ended probe element 90, e.g., P/N 100547-00 from Interconnect Device Inc. is attached by an adaptor 92 to the probe body 88. The probe element 90 is a coaxial probe element whereby the signal is communicated on a center conductor and the return ground is provided by an outer conductor, with these conductors being separated by an insulating material. More specifically, one end 93 of the probe element 90 is inserted into an opening 94 at a first end 96 of the stepped cylindrical shaped adaptor 92. One end 98 of the probe body 88 is inserted into an opening (not shown) at another end 100 of the adaptor 92, such that the end 93 is electrically connected to the end 98 of the probe body 88. The probe element 90 and the probe body 88 are maintained in electrical contact and are physically retained within the adaptor 92 by a pair of screws 102 which are received in threaded mounting holes 104 in the adaptor 92. When the screws 102 are tightened a slot 105 in the adapter 92 closes on the probe element 90 and the probe body 88, as is clearly shown in the FIGURE. A coaxial cable 106 is connected to another end of the probe body 88 by a coaxial connecter 108, as is well known. The other end of this cable 106 is connected to desired testing apparatus for measuring, recording or analyzing the signal as dictated by the particular test application. As stated before, this probe 61 permits nondestructive measurements in the 3–9 Ghz range with very little disturbance to the signal under investigation, due primarily to the short return ground paths provided by the ground pins 86, the metal probe plate 36 and the outer conductor of the probe element 90.

In the low frequency (including d.c.) probe embodiment (as described in the embodiment of FIG. 6), two probes are required, the probe 61, described above for measurement (i.e., the signal probe) and a second probe 61' for ground connection. The second probe 61' is of the same type as the measurement probe 61. A wire 110 having resilient connections 112 at each end thereof electrically interconnects these probes to provide the return ground path. Accordingly, the probe 61 would be connected to the pin of the MCM to be measured and the probe 61' would be connected to a ground pin of the MCM. A shorting plug 113 is connected to the other end of the probe body 88 of probe 61' to short the ground connection provided by the probe 61' to the probe body 88 of probe 61', thereby completing the ground circuit when wire 110 is connected.

Temporary modifications to the system board 11 or module nets are possible with the probe test assembly 14 of the present invention. For example, a 1:1 probe 61 may be used with a temporary short applied to a signal pin, whereby a tie to ground would then be available. Similarly, any combination of terminations, voltages or grounds may be applied through the probe 61 to the system board or module nets. Misconnection, improper terminations, or the need to override a present termination of a net or nets for system analysis are very desirable. Temporary connection of multiple nets are also possible by using two 1:1 probes 61 connected together by a short length of coax cable. This provides the ability to DOT OR circuits for a period of time, which is extremely useful in the early stages of bring up when the system architecture is used for the first time.

Figure 8:
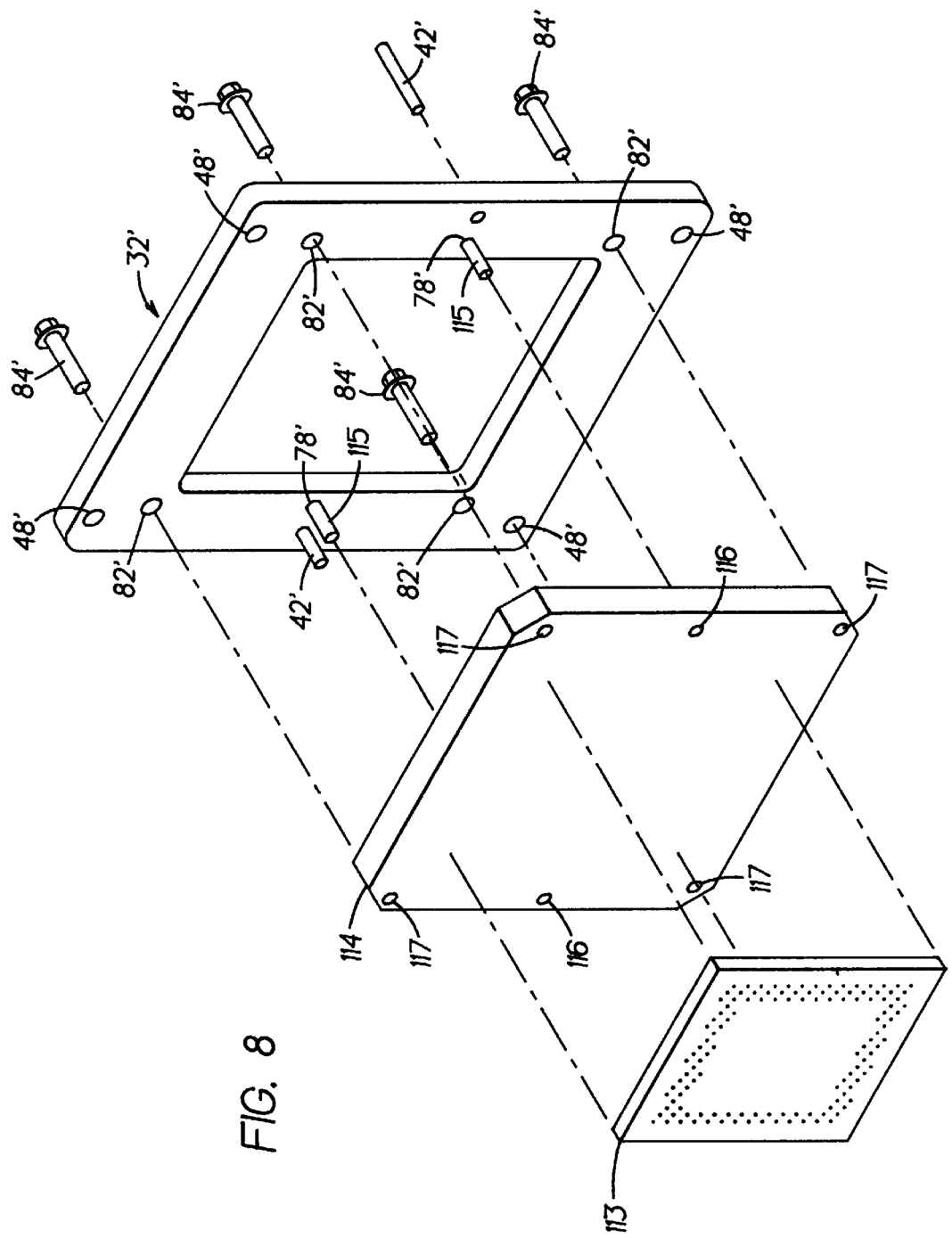
FIG. 8 is a perspective view of a system enhancement assembly in accordance with the present invention.

Alternatively, a system enhancement device, such as a MCM or Single Chip Module (SCM) having additional Central Processing Units (CPU's) or other features, may be installed on the system board 11 to enhance the function of the system board, providing the system board has reserved I/O interfaces at the location of opening 12. This functionality of this enhancement device can be made to work with a crypto circuit to insure that an upgrade or other operation is authorized. Referring to FIG. 8, the enhancement device 113 is supported on a supporting or carrying substrate 114. A plurality of alignment pins 115 are mounted in holes 116 of the substrate 114 and are received in corresponding alignment holes 78' in a frame 32' (the frame 32' is the same as frame 32 described hereinbefore) to orientate the enhancement device 113 on the frame 32 and ultimately relative to the I/O interfaces on the system board 11. The substrate 114 has four mounting holes 117 therethrough which align with a plurality of mounting holes 82' in the frame 32'. The substrate 114 is secured onto the frame 32' by screws 84' (or other suitable fastening means) through these mounting holes. The frame 32' has four mounting holes 48' therethrough which align with the plurality of mounting holes 24 in the stiffener 10, whereby this assembly is secured onto the stiffener 10 by screws (or other suitable fastening means), not shown, through these mounting holes.

Figure 9:
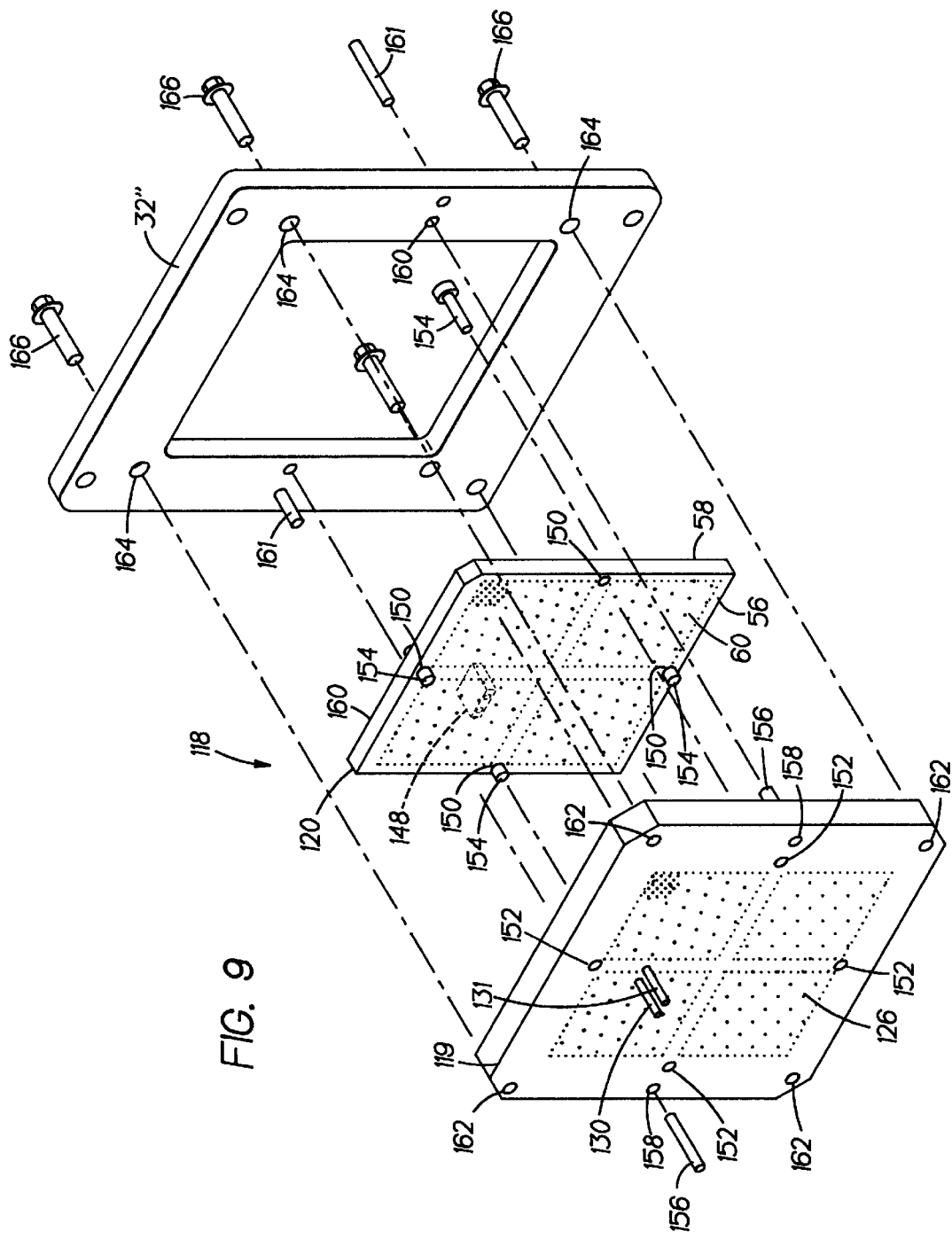
FIG. 9 is a perspective view of an interface assembly in accordance with the present invention.
Figure 10:
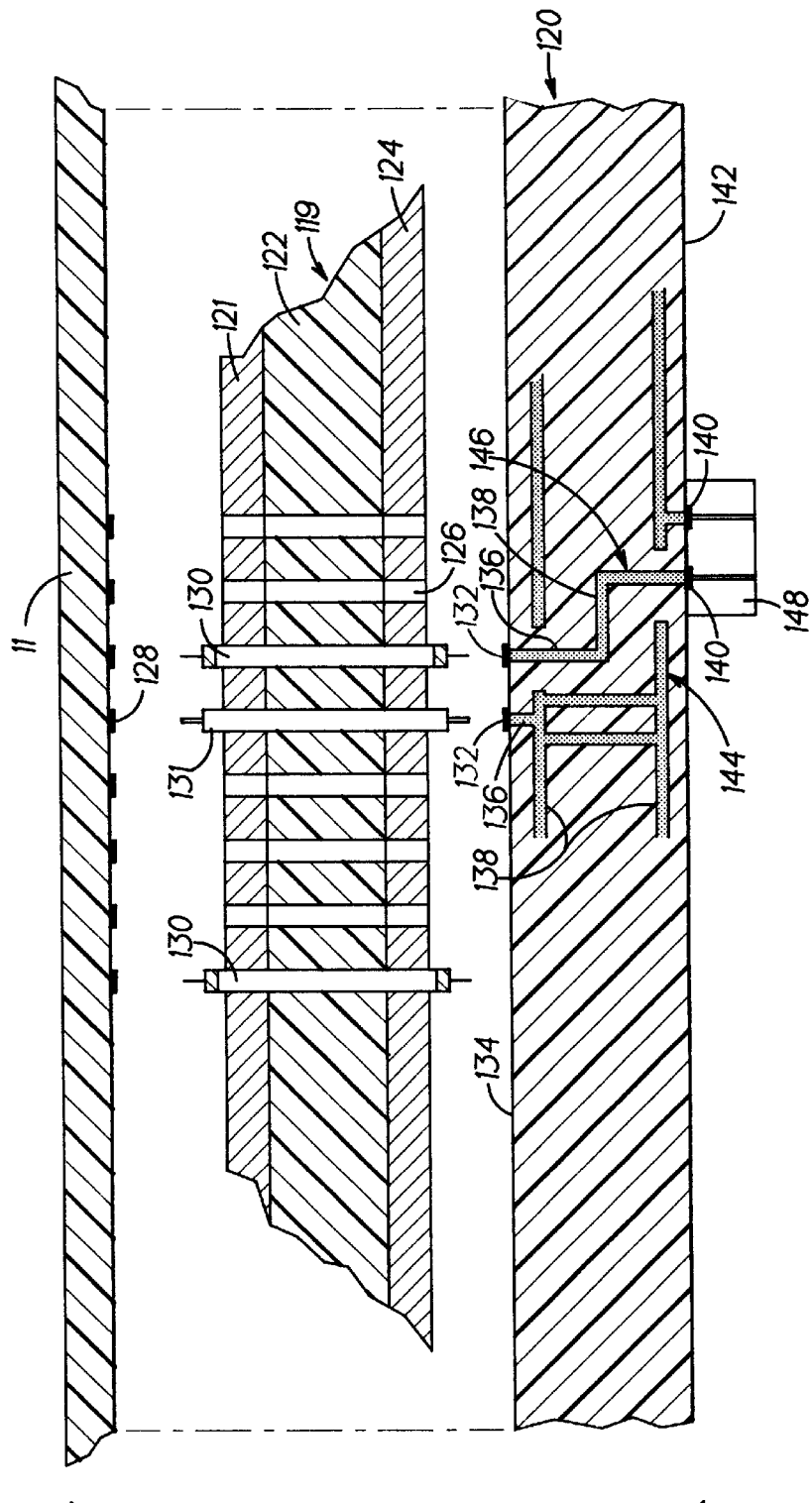
FIG. 10 is a partial section view of the interface assembly of FIG. 9.

Referring to FIGS. 9 and 10, in accordance with another alternate embodiment of the present invention an interface assembly 118 is positioned at the opening 12, after the manhole cover 16 has been removed, and is retained and located thereat by the frame 32" (the frame 32" is the same as frame 32 described hereinbefore) in the same manner described herein with respect to the previous embodiments. The interface assembly 118 provides for system board engineering change capabilities and functional upgrade capabilities, providing that the system board 11 has reserved MCM pin locations and spare nets which are prewired in the system board. An example of such capabilities is where the MCM on the system board 11 is replaced in the field with increased functions or modifications. These new circuit functions would normally be brought to prededicated I/O pins. The interface assembly 118 is configured to connect the spare board wires that were previously defined in the system board 11 to new module I/O and board locations. The interface assembly 118 comprises an interface board 119 and an interconnect printed circuit board 120. The interface board 119 has a first layer 121 comprised of gold plated brass, one or more second layers 122 of insulating material such as FR4 and a third layer of gold plated brass 124. Layers 121 and 124 are applied to layer 122 by vapor deposition or any other suitable method (such as a layer of sheet brass that is gold plated). A pattern or array of holes 126 corresponding to the pattern of I/O interfaces (pads) 128 on the system board 11 are provided through the interface board 119. Resilient coaxial probe connectors (pins) 130 are located in selected holes 126 for connecting to signal pads. The probe connectors 130 are coaxial whereby there is a center conductor and an outer conductor, which are separated by an insulating material. Double ended, so-called 'POGO' ground pins 131 are located (to preferably define a small ground loop with respect to the measured signal) in selected holes 126 for providing a return or ground connection.

The interconnect circuit board 120 comprises a multilayer printed circuit board having pads 132 (which connect with pins 130 and 131) at one surface 134 thereof which are connected by vias 136 to traces 138 at various layers of the circuit board 120 and to pads 140 at the other surface 142 of the circuit board 120. The ground path is designated 144 and the signal path is designated 146. A connector 148 (e.g., a dual in line pin connector) is connected to signal and ground pads 140 at surface 142 of the circuit board 120. A mating connector (not shown) is interconnected with connector 148 to provide access to the this signal and ground pair for testing (or other purposes).

The interconnect circuit board 120 has a plurality holes 150 therethrough which align with a plurality of mounting holes 152 in the interconnect circuit board 120. The interconnect circuit board 120 is secured onto the interface board 119 by screws 154 (or other suitable fastening means) through these mounting holes. A plurality of alignment pins 156 are mounted in holes 158 of the interface board 119 and extend away from surface 134. The pins 156 are received in corresponding alignment holes 160 in the frame 32" to position the interconnect circuit board 120 and the interface board 119 on the frame 32" and ultimately relative to the locations on the system board. Alignment pins 161 are provided for attachment of the frame 32" in the same manner described in the above embodiments. The interface board 119 has four mounting holes 162 therethrough which align with a plurality of mounting holes 164 in the frame 32". The interface board 119 is secured onto the frame 32" by screws 166 (or other suitable fastening means) through these mounting holes.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A probe test assembly for facilitating probing of a device under test of a system board under temporary system testing, the system board having a stiffener mounted thereto, said probe test assembly comprising:

a frame having fastening means for temporarily attaching said frame to the stiffener of the system board, said frame having an access opening for allowing access therethrough to an area of interest on the system board;

a pattern plate having a plurality of guide holes therethrough and accessible through said access opening of said frame, said pattern plate comprised of an insulating material, said plurality of guide holes providing a pattern of probe interconnection sites;

an electrically conductive probe plate having a plurality of probe holes therethrough which are aligned with said guide holes in said pattern plate, the pattern plate fastened to the probe plate and the probe plate fastened to the frame;

a ground pin disposed in one of said probe holes in said probe plate, said ground pin being electrically connected to said probe plate and extending from said one of said probe holes in said probe plate; and wherein during use of said probe test assembly said probe holes are positioned relative to the device under test on said system board for probing a signal thereon, and said ground pin is located for electrical connection of said ground pin to a ground of the system board.

2. The probe test assembly of claim 1, further comprising:

a probe having a coaxial probe element for insertion through desired said guide holes and associated said probe holes to probe a signal of the device under test, said probe being independent of and dismounted from said guide holes and said probe plate, wherein during use of said probe a center conductor of said coaxial probe element provides for probing the signal and an outer conductor of said coaxial probe element electrically connects with said probe plate to provide a return ground path.

3. The probe test assembly of claim 2 wherein the probe comprises:

a probe body; and an adaptor having a first opening receiving one end of said probe body and a second opening receiving one end of said coaxial probe element, said coaxial probe element comprises a coaxial resilient double ended probe element, said first and second openings in said adaptor are configured to provide electrical interconnection of said probe body and said coaxial probe element.

4. The probe test assembly of claim 1 wherein said frame comprised of an electrically insulating material.

5. The probe test assembly of claim 1 wherein the pattern plate is positioned within the access opening of the frame.

6. The probe test assembly of claim 1 wherein the probe plate includes a substantially planar surface facing the pattern plate, and the pattern plate includes a substantially planer surface facing the probe plate, wherein the surface of the probe plate is larger than the surface of the pattern plate.

7. The probe test assembly of claim 1 wherein the pattern plate is connected to the frame by the probe plate.

8. The probe test assembly of claim 1 wherein the probe plate includes a first surface facing the pattern plate and the frame, and a second surface, the second surface comprising a plurality of standoffs projecting from the second surface for providing structural reinforcement to the system board when the probe test assembly is in place.

9. The probe test assembly of claim 1 wherein the probe plate is screwed to the pattern plate and the probe plate is screwed to the frame.

10. An assembly for testing, comprising:

a system board having an area of interest for testing;

a stiffener mounted to said system board, said stiffener having an opening at the area of interest;

a cover removably mounted to said stiffener at said opening therein, wherein said cover is mounted to said stiffener and protects the area of interest on the system board when testing of the area of interest is not desired and wherein said cover is completely removed from said stiffener when testing of the area of interest is desired; and a frame having fastening means for temporarily attaching said frame to said stiffener when test of the area of interest is desired, said frame allowing access therethrough to the area of interest on said system board; and a plate assembly having a plurality of holes therethrough and mounted to said frame, said plurality of holes providing a pattern of probe interconnection sites to provide for probing access to the area of interest on said system board.

11. The assembly of claim 10 wherein said plate assembly is comprised of an insulating material.

12. The assembly of claim 11 further comprising:

a signal probe having a probe element for insertion through one of said holes in said plate assembly to probe a signal at the area of interest; and a ground probe having a probe element for insertion through another one of said holes in said plate assembly to electrically connect with a ground of said system board at the area of interest, said ground probe being electrically coupled with said signal probe to provide a return ground path.

13. The assembly of claim 10 further comprising:

a gasket positioned at one side of said cover for providing shielding.

14. The assembly of claim 10 wherein the plate assembly comprises:

a pattern plate having a plurality of guide holes therethrough, said pattern plate is comprised of an insulating material;

an electrically conductive probe plate associated with said pattern plate, said electrically conductive probe plate having a plurality of probe holes therethrough which are aligned with said guide holes in said pattern plate; and a ground pin disposed in one of said probe holes in said probe plate, said ground pin being electrically connected to said probe plate and extending from said one of said probe holes in said probe plate.

15. The assembly of claim 14 further comprising:

a probe having a coaxial probe element for insertion through desired said guide holes and associated said probe holes to probe a signal of the device under test, said probe being independent of and dismounted from said guide holes and said probe plate, wherein during use of said probe a center conductor of said coaxial probe element provides for probing the signal and an outer conductor of said coaxial probe element electrically connects with said probe plate to provide a return ground path.

16. The assembly of claim 15 wherein the probe comprises:

a probe body; and an adaptor having a first opening receiving one end of said probe body and a second opening receiving one end of said coaxial probe element, said coaxial probe element includes a coaxial resilient double ended probe element, said first and said second openings in said adaptor are configured to provide electrical interconnection of said probe body and said coaxial probe element.

17. The assembly of claim 14 wherein the probe plate is insulated from the stiffener by the frame.

18. The assembly of claim 14 wherein the frame includes an access opening and the pattern plate is positioned within the access opening.

19. The assembly of claim 14 wherein the probe plate is fastened to the pattern plate and the probe plate is fastened to the frame.

20. The assembly of claim 19 wherein the pattern plate and the frame are indirectly connected by the probe plate.

21. The assembly of claim 10 wherein the area of interest includes pins of a multi chip module, said multi chip module is mounted on said system board.

22. The assembly of claim 10 wherein the dover includes standoffs projecting from the surface of the cover for structurally reinforcing the system board when in place.

23. The assembly of claim 10 wherein the stiffener is metal.

24. The assembly of claim 10 wherein the fastening means comprises screws.

* * * * *

UNITED STATES PATENT AND TRADEMARK OFFICE
CERTIFICATE OF CORRECTION

PATENT NO. : 6,433,562 B1  
DATED : August 13, 2002  
INVENTOR(S) : McAllister et al.

It is certified that error appears in the above-identified patent and that said Letters Patent is hereby corrected as shown below:

Column 4,  
Line 25, after "described" delete "MORE" and insert -- more --.

Column 10,  
Line 43, after "the" delete "dover" and insert -- cover --.

Signed and Sealed this

Twenty-eighth Day of February, 2006

JON W. DUDAS  
*Director of the United States Patent and Trademark Office*